United States Patent
Xi et al.

(10) Patent No.: US 11,985,814 B2
(45) Date of Patent: May 14, 2024

(54) METHOD FOR MANUFACTURING BIT LINE STRUCTURE, METHOD FOR MANUFACTURING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventors: Ning Xi, Hefei (CN); Peimeng Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 235 days.

(21) Appl. No.: 17/446,445

(22) Filed: Aug. 30, 2021

(65) Prior Publication Data

US 2022/0052054 A1     Feb. 17, 2022

Related U.S. Application Data

(63) Continuation of application No. PCT/CN2021/100459, filed on Jun. 16, 2021.

(30) Foreign Application Priority Data

Aug. 13, 2020   (CN) .......................... 202010811435.X

(51) Int. Cl.
*H10B 12/00*   (2023.01)
*H01L 21/02*   (2006.01)
(Continued)

(52) U.S. Cl.
CPC ....... *H10B 12/482* (2023.02); *H01L 21/0206* (2013.01); *H01L 21/76853* (2013.01); *H01L 23/528* (2013.01); *H10B 12/485* (2023.02)

(58) Field of Classification Search
None
See application file for complete search history.

(56) References Cited

U.S. PATENT DOCUMENTS 6,242,309 B1 *   6/2001   Lee ........................ H10B 41/30
                                                  438/266
9,577,070 B2   2/2017   Tsai et al.
(Continued)

FOREIGN PATENT DOCUMENTS

| CN | 101170080 A |   | 4/2008 |   |
|---|---|---|---|---|
| CN | 104979213 A | * | 10/2015 | ....... H01L 21/76229 |

(Continued)

OTHER PUBLICATIONS

Seo D, Bae J S, Oh E, et al. Selective wet etching of Si_3N_4/SiO_2 in phosphoric acid with the addition of fluoride and silicic compounds[J]. Microelectronic Engineering, 2014, 118(apr.):66-71.
(Continued)

*Primary Examiner* — Michael Lebentritt
(74) *Attorney, Agent, or Firm* — Syncoda LLC; Feng Ma

(57) ABSTRACT

A method for manufacturing a bit line structure includes the following operations. A bit line conductive layer is formed on a surface of a semiconductor substrate, and the bit line conductive layer is partially located in a groove in the surface of the semiconductor substrate. A first protective layer is formed on surfaces of the bit line conductive layer and the semiconductor substrate. A first barrier layer is formed on a surface of the first protective layer. The surface of the first barrier layer is subjected with passivating treatment. A sacrificial layer is formed on the surface of the first barrier layer, and is provided with a filling part filled in the groove. A part, other than the filling part, of the sacrificial layer is cleaned and stripped.

19 Claims, 8 Drawing Sheets

(51) Int. Cl.
   *H01L 21/768*   (2006.01)
   *H01L 23/528*   (2006.01)

(56) References Cited

U.S. PATENT DOCUMENTS

| | | |
|---|---|---|
| 9,691,629 B2 | 6/2017 | Cooper et al. |
| 10,522,548 B2 | 12/2019 | Chun |
| 10,522,641 B2 | 12/2019 | Tsai et al. |
| 10,741,662 B2 | 8/2020 | Tsai et al. |
| 10,825,819 B2 | 11/2020 | Kim et al. |
| 10,861,856 B2 | 12/2020 | Chun |
| 10,868,129 B2 | 12/2020 | Tsai et al. |
| 2015/0284593 A1 | 10/2015 | Wang et al. |
| 2016/0149017 A1 | 5/2016 | Tsai et al. |
| 2017/0162663 A1 | 6/2017 | Tsai et al. |
| 2018/0122898 A1 | 5/2018 | Park |
| 2018/0342520 A1 | 11/2018 | Chun |
| 2018/0342521 A1 | 11/2018 | Son |
| 2020/0006512 A1 | 1/2020 | Tsai et al. |
| 2020/0058754 A1 | 2/2020 | Tsai et al. |
| 2020/0083226 A1 | 3/2020 | Chun |
| 2020/0194439 A1 | 6/2020 | Kim et al. |
| 2021/0013212 A1 | 1/2021 | Kim et al. |

FOREIGN PATENT DOCUMENTS

| | | | | |
|---|---|---|---|---|
| CN | 105633080 A | | 6/2016 | |
| CN | 107706179 A | | 2/2018 | |
| CN | 109003938 A | | 12/2018 | |
| CN | 109994473 A | | 7/2019 | |
| CN | 110491876 A | * | 11/2019 | ....... H01L 27/10805 |
| CN | 110491876 A | | 11/2019 | |
| CN | 111326517 A | * | 6/2020 | ....... H01L 21/76897 |
| CN | 111326517 A | | 6/2020 | |
| CN | 109698274 B | * | 5/2021 | ....... H01L 27/10829 |
| CN | 115312521 A | * | 11/2022 | ....... H01L 21/76832 |
| JP | 2004047948 A | | 2/2004 | |

OTHER PUBLICATIONS

Fang X, Hui W, Shi-Zhou L. Hot Phosphoric Acid Etch Rate to $Si\_3N\_4$ in Wet Etching[J]. Semiconductor Technology, 2007.

Chien Y H C, Hu C C, Yang C M. A Design for Selective Wet Etching of Si 3 N 4 /SiO 2 in Phosphoric Acid Using a Single Wafer Processor[J]. Journal of The Electrochemical Society, 2018, 165(4):H3187-H3191.

Kim T, Son C, Park T, et al. Effect of SiO 2 Etching Inhibitor to H 3 PO 4 for the Selective Si 3 N 4 Wet Etching of 3D NAND[J]. Ecs Transactions, 2019, 92(2): 137-142.

First Office Action of the Japanese application No. 2022-539177, dated Aug. 1, 2023. 7 pages with English translation.

\* cited by examiner

METHOD FOR MANUFACTURING BIT LINE STRUCTURE, METHOD FOR MANUFACTURING SEMICONDUCTOR STRUCTURE, AND SEMICONDUCTOR STRUCTURE

CROSS-REFERENCE TO RELATED APPLICATIONS

This is a continuation of International Application No. PCT/CN2021/100459 filed on Jun. 16, 2021, which claims priority to Chinese Patent Application No. 202010811435.X filed on Aug. 13, 2020. The disclosures of these applications are hereby incorporated by reference in their entirety.

BACKGROUND

With the rapid development of nano-devices in semiconductor industry in recent years, the feature dimension is reduced continuously in the production of chip. In addition, the whole technology still continues to develop further refinement of critical dimensions. For example, in the manufacturing process of an advanced Dynamic Random Access Memory (DRAM), the process level for forming a bit line will seriously affect the electrical property, yield, and reliability of the chip in subsequent stages. Particularly, with continuous reduction of the critical dimensions, the requirements on the refinement and stability of a sacrificial layer are higher and higher. A process for stripping the sacrificial layer of the bit line becomes more and more important.

SUMMARY

The present disclosure relates generally to the technical field of semiconductors, and more specifically to a method for manufacturing bit line structure, a method for manufacturing semiconductor structure, and a semiconductor structure.

An objective of the present disclosure is to provide a method for manufacturing a bit line structure, which can prevent a conductive layer from being damaged by an etching solution to overcome at least one defect in the related art mentioned above.

Another main objective of the present disclosure is to provide a method for manufacturing a semiconductor structure by adopting the method for manufacturing the bit line structure mentioned above to overcome the at least one defect in the related art mentioned above.

Yet another objective of the present disclosure is to provide a semiconductor structure manufactured by the method for manufacturing the semiconductor structure mentioned above to overcome the at least one defect in the related art mentioned above.

To achieve the objectives mentioned above, the present disclosure provides the following technical solutions.

According to one aspect of the present disclosure, a method for manufacturing a bit line structure is provided. The bit line structure manufacturing method may include the following operations.

A bit line conductive layer is formed on a surface of a semiconductor substrate. The bit line conductive layer is partially located in a groove in the surface of the semiconductor substrate.

A first protective layer is formed on a surface of the bit line conductive layer and the surface of the semiconductor substrate.

A first barrier layer is formed on a surface of the first protective layer.

A surface of the first protective layer is subjected with passivating treatment.

A sacrificial layer is formed on the surface of the first barrier layer. The sacrificial layer is provided with a filling part filled in the groove.

A part, other than the filling part, of the sacrificial layer is cleaned and stripped by using an etching solution.

According to another aspect of the present disclosure, a method for manufacturing a semiconductor structure is provided. The method for manufacturing the semiconductor structure may include the following operations.

A semiconductor substrate is provided, and a surface of the semiconductor substrate is provided with a groove.

A bit line structure is formed on the semiconductor substrate by the method for manufacturing the bit line structure provided by the present disclosure and mentioned in the above embodiments.

According to one embodiment of the present disclosure, the passivating treatment may include plasma treatment. The passivating treatment on the first barrier layer may include the following operations.

A treatment chamber of treatment equipment is preheated.

The semiconductor structure with the first barrier layer formed thereon is placed in the treatment chamber.

A reaction medium is input and the surface of the first barrier layer is subjected with the plasma treatment.

The treatment chamber is cooled.

And, the semiconductor structure is taken out.

According to yet another aspect of the present disclosure, a semiconductor structure is provided. The semiconductor structure may include a semiconductor substrate, a bit line conductive layer, and a bit line plug spacer layer. A surface of the semiconductor substrate may be provided with a groove. The bit line conductive layer may be partially located in the groove in the surface of the semiconductor substrate. The bit line plug spacer layer may be filled in the groove. The bit line plug spacer layer may include a first protective layer, a first barrier layer subjected with passivating treatment, and a filling part.

Figure 1:
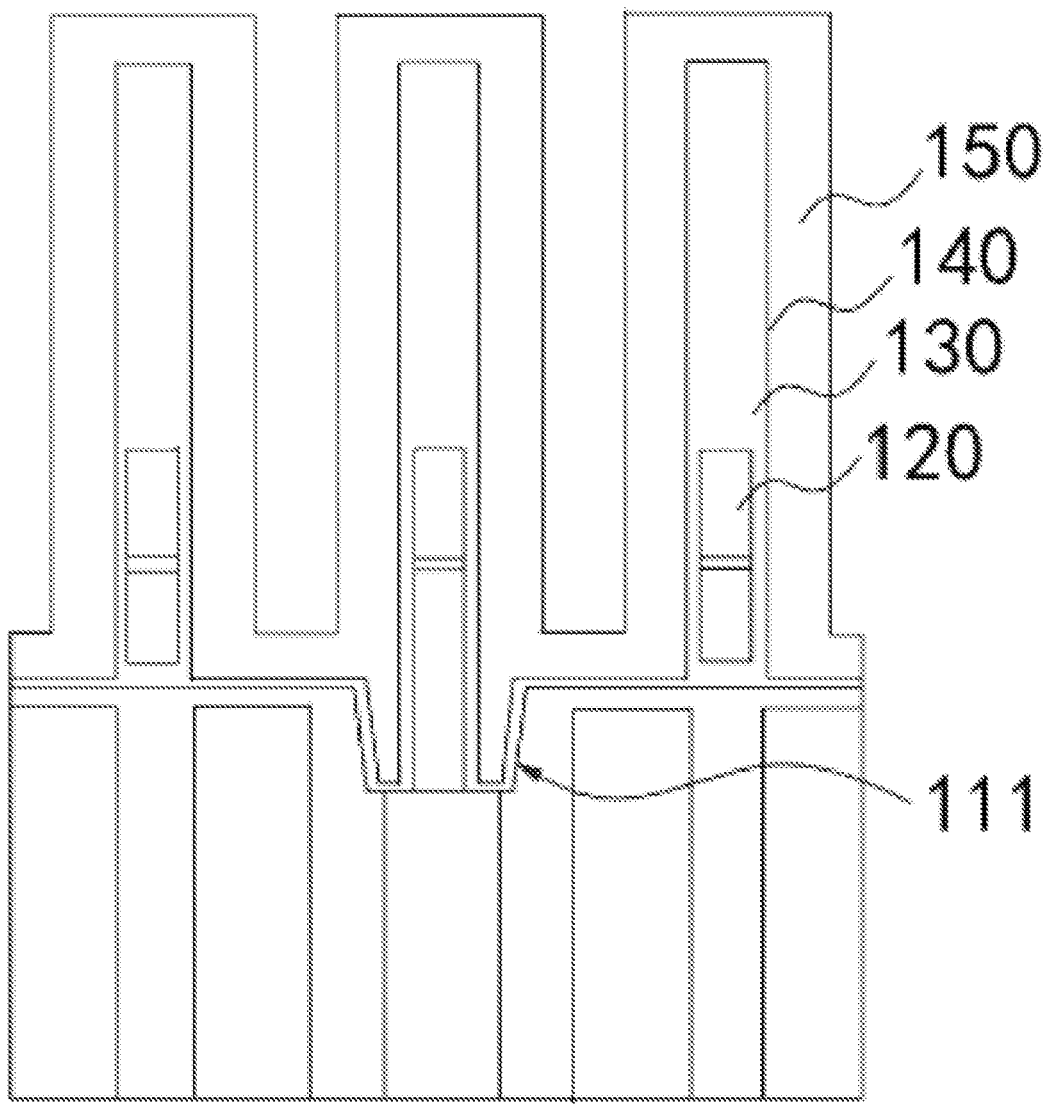
FIG. 1 schematically shows a structure of a semiconductor structure in one operation of a method for manufacturing a bit line structure.

Reference numerals in the accompanying drawings are described as follows.

111: groove;
120: conductive layer;
121: etching damage;
130: protective layer;
140: barrier layer;
150: sacrificial layer;
210: semiconductor substrate;
211: groove;
220: bit line conductive layer;
221: metal layer;
222: bit line plug;
223: titanium nitride;
230: first protective layer;
240: first barrier layer;
241: first thin film layer;
242: second thin film layer;
250: sacrificial layer;
251: filling part;
260: bit line plug spacer layer

DETAILED DESCRIPTION

Exemplary embodiments will now be described more comprehensively with reference to the accompanying drawings. However, the exemplary embodiments can be embodied in a variety of forms and should not be construed as being limited to the embodiments set forth herein. Instead, these embodiments are provided so that the present disclosure will be thorough and complete, and the concepts of the exemplary embodiments are fully conveyed to those skilled in the art. The same reference numerals in the drawings denote the same or similar structures. The detailed description thereof will be omitted.

Figure 2:
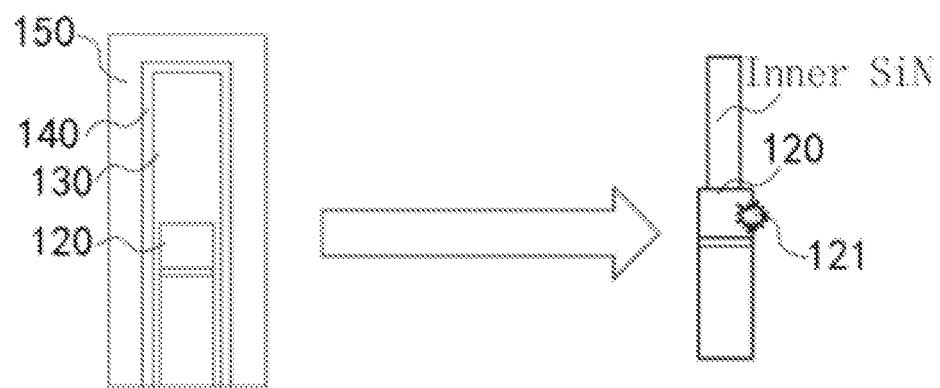
FIG. 2 is an enlarged comparison diagram of a partial structure of the bit line structure shown in FIG. 1 before and after a sacrificial layer is etched and stripped.

As shown in FIG. 1 and FIG. 2, in a manufacturing process, an etching solution (for example, phosphoric acid solution, $H_3PO_4$) has a smaller etching selection ratio for the sacrificial layer 150 (for example, silicon nitride, $Si_3N_4$) and a barrier layer 140 (for example, silicon dioxide, $SiO_2$) (i.e., the ratio of the rate of the sacrificial layer 150 etched by the etching solution to the rate of the barrier layer 140 etched by the etching solution), such that it is easy to etch and strip the barrier layer 140 when the etching solution cleans and strips the sacrificial layer 150, thereby partially stripping a protective layer 130, and causing an etching damage 121 (W Missing, W being tungsten) to a conductive layer 120 in the barrier layer 140.

Various embodiments of the present disclosure can optimize a method for manufacturing a bit line structure.

Referring to FIG. 3 to FIG. 8, they respectively and representatively show schematic diagrams of a semiconductor structure in various operations of the method for manufacturing the bit line structure provided by the present disclosure. In the exemplary example, the method for manufacturing the bit line structure provided by the present disclosure is described by taking the preparation of a bit line applied to a DRAM as an example. It is easy for those skilled in the art to understand that a variety of modifications, additions, substitutions, deletions or other changes can be made to the following specific examples in order to apply related designs of the present disclosure to the manufacturing methods of other types of semiconductor structures, which are still within the scope of the principle of the bit line structure manufacturing method provided in the present disclosure.

As shown in FIG. 3 to FIG. 8, in this example, the method for manufacturing the bit line structure provided by the present disclosure include the following operations.

A bit line conductive layer 220 is formed on a surface of a semiconductor substrate 210. The bit line conductive layer 220 is partially located in a groove 211 in the surface of the semiconductor substrate 210.

A first protective layer 230 is formed a surface of the bit line conductive layer 210 and the surface of the semiconductor substrate 230.

A first barrier layer 240 is formed on a surface of the first protective layer 230.

A surface of the first barrier layer 240 is subjected with passivating treatment.

A sacrificial layer 250 is formed on the surface of the first barrier layer 240. The sacrificial layer 250 is provided with a filling part 251 filled in the groove 211. A part, other than the filling part 251, of the sacrificial layer 250 is cleaned and stripped by using an etching solution.

So far, the manufacture of the semiconductor bit line is basically completed.

Through the previously design, the etching selectivity of the etching solution to the sacrificial layer 250 relative to the first barrier layer 240 is increased by performing passivating treatment on the first barrier layer 240, so that the conductive layer 220 in the first barrier layer 240 cannot be damaged when the sacrificial layer 250 is cleaned and stripped by using the etching solution. In addition, compared with the related art, various embodiments of the present disclosure neither need to add an active agent in the etching solution, nor need to increase the thickness of the first barrier layer 240.

Figure 3:
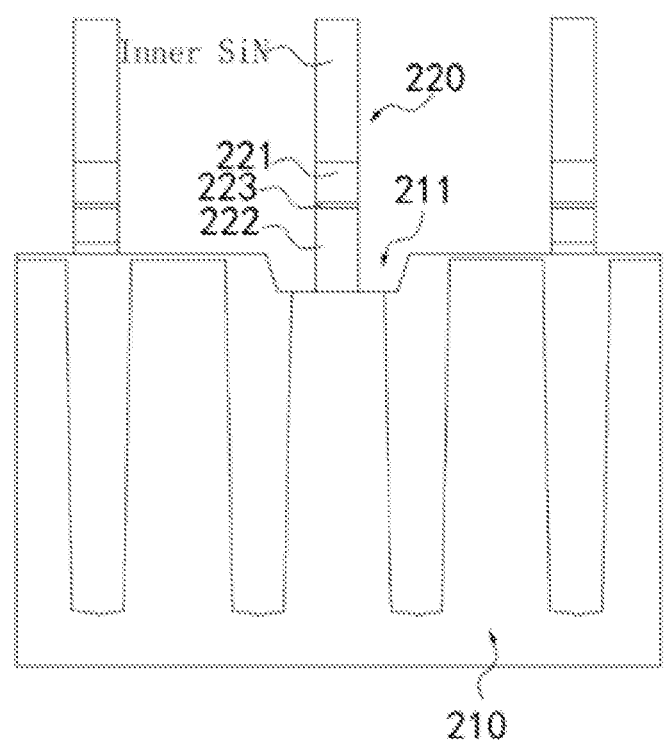
FIG. 3 schematically shows a structure of a semiconductor structure in one operation of the method for manufacturing a bit line structure shown in an exemplary example.

Specifically, as shown in FIG. 3, a semiconductor layered structure is specifically shown, which may be used as a representative example of a semiconductor structure in the operation that "a bit line conductive layer 220 is formed" in this example. A surface of the semiconductor substrate 210 is provided with a groove 211. The bit line conductive layer 220 is formed at the groove 211 in the surface of the semiconductor substrate 210, and the bit line conductive layer 220 includes a metal layer 221 and a bit line plug 222, and may further include Titanium Nitride 223 (TiN) and silicon nitride cover layer. The bit line plug 222 is formed in the groove 211 in the surface of the semiconductor substrate 210. The layer of titanium nitride 223 is formed on the bit line plug 222. The metal layer 221 is formed on the layer of titanium nitride 223. A layer of silicon nitride is further formed on the metal layer 221.

Figure 4:
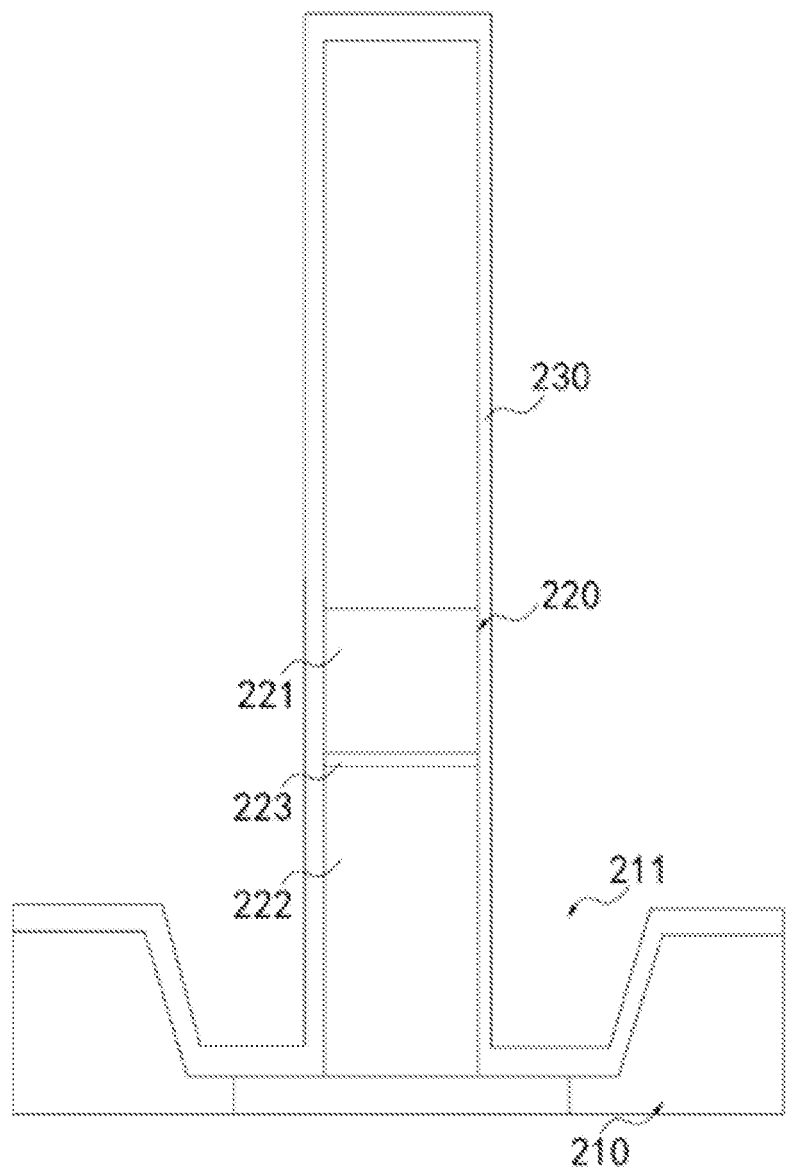
FIG. 4 is an enlarged schematic diagram of one bit line structure of a semiconductor structure in one operation of the method for manufacturing a bit line structure shown in an exemplary example.

Specifically, as shown in FIG. 4, an enlarged layered structure of the semiconductor bit line is specifically shown, which may be used as a representative example of a bit line in the operation that "a first protective layer 230 is formed" in the this example. The first protective layer 230 is formed on the surface of the bit line conductive layer 220 and the surface of the semiconductor substrate 210 (the part without the bit line conductive layer 220). That is, the first protective layer 230 is formed on both the wall and part groove bottom without the bit line conductive layer 220 (bit line plug 222) of the groove 211.

Preferably, in this example, for the operation that "a first protective layer 230 is formed", the thickness of the first protective layer 230 may preferably be 1 nm to 3 nm, for example, 1 nm, 1.5 nm, 2 nm, and 3 nm. In other examples, the thickness of the first protective layer 230 may be less than 1 nm, or may be greater than 3 nm, for example, 0.8 nm, 4 nm, and 5 nm, which is not limited to this example.

Preferably, in this example, for the operation that "a first protective layer 230 is formed", the material of the first protective layer 230 may preferably include silicon nitride. In the operation that "a sacrificial layer 250 is formed", the material of the sacrificial layer 250 may also preferably include silicon nitride. For the convenience of distinguishing, when the silicon nitride layer serves as the first protective layer 230, it may be called Inner SiN, and when the silicon nitride layer serves as the sacrificial layer 250, it may be called Outer SiN.

Figure 5:
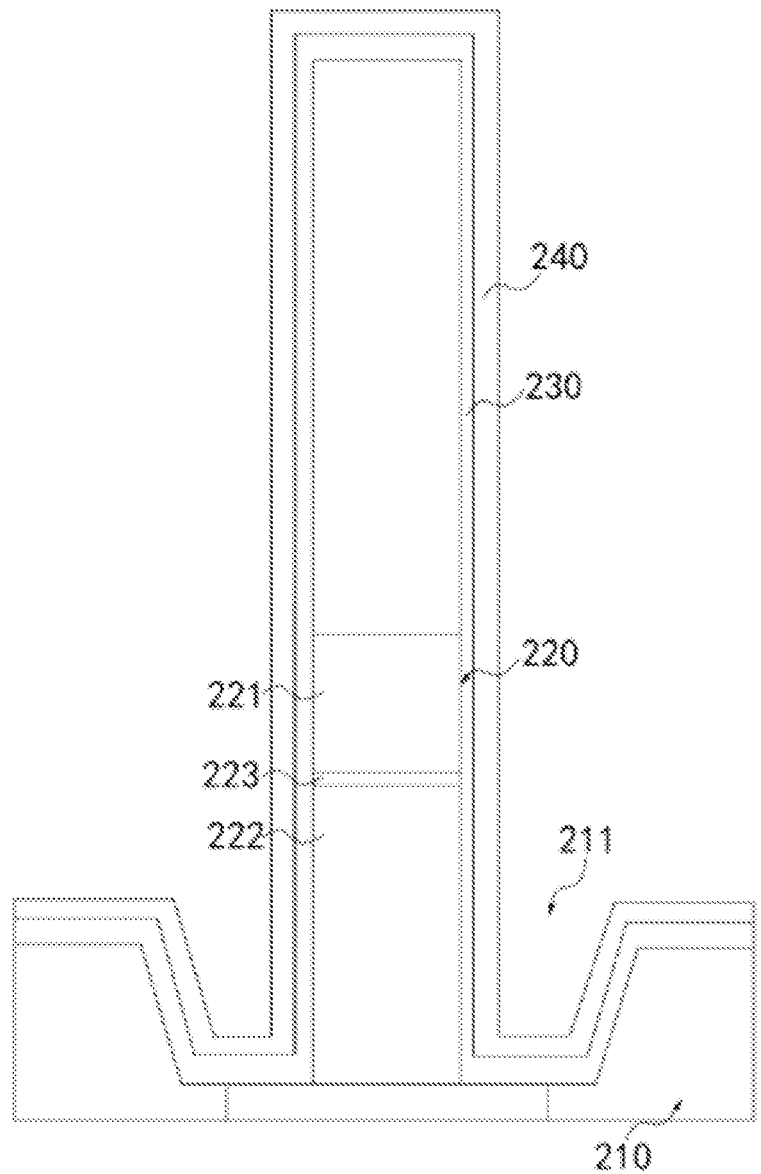
FIG. 5 is an enlarged schematic diagram of one bit line structure of a semiconductor structure in one operation of the method for manufacturing a bit line structure shown in an exemplary example.

Specifically, as shown in FIG. 5, an enlarged layered structure of a semiconductor bit line is specifically shown, which may be used as a representative example of a bit line in the operation that "a first barrier layer 240 is formed" in this example. The first barrier layer 240 is formed on the surface of the first protective layer 230. That is, the first protective layer 230 and the first barrier layer 240 are formed on both the wall and part groove bottom without the bit line conductive layer 220 (bit line plug 222) of the groove 211. In this example, the material of the first barrier layer 240 may include, but is not limited to, silicon oxide.

Figure 6:
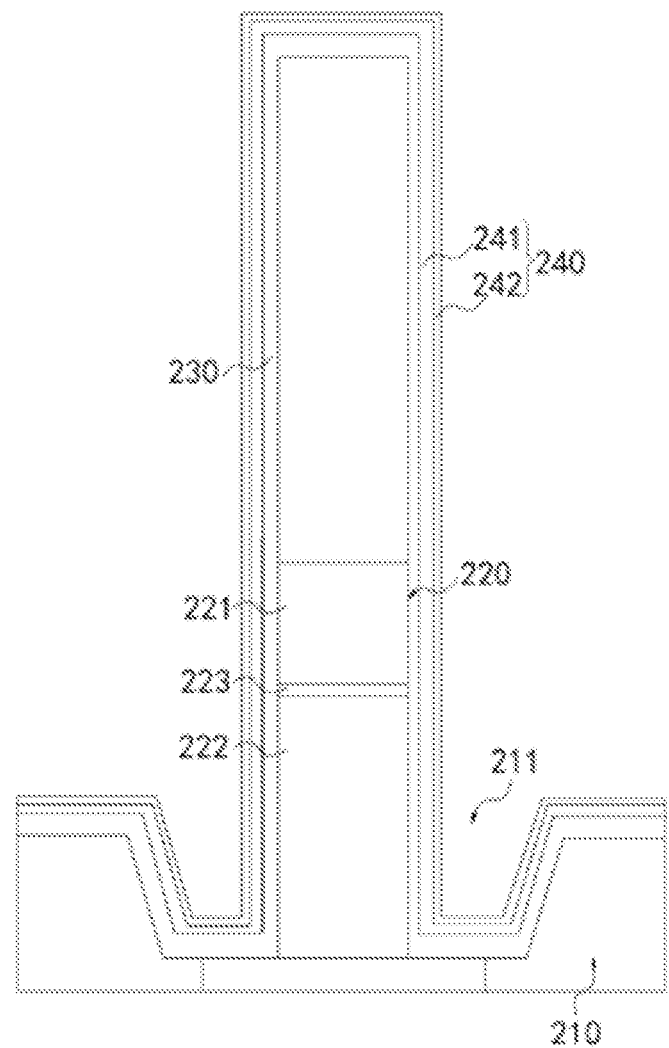
FIG. 6 is an enlarged schematic diagram of one bit line structure of a semiconductor structure in one operation of the method for manufacturing a bit line structure shown in an exemplary example.

Specifically, as shown in FIG. 6, an enlarged layered structure of a semiconductor bit line is specifically shown, which may be used as a representative example of a bit line structure in the operation of "passivating treatment" in this example. The operation is that the surface of the first barrier layer 240 is subjected with passivating treatment after the first barrier layer 240 is formed on the surface the first protective layer 230.

Preferably, in this example, for the operation of "passivating treatment", the passivating treatment performed on the first barrier layer 240 may preferably include plasma treatment. Further, the plasma treatment may preferably be nitrogen plasma treatment. In other examples, the passivating treatment performed on the first barrier layer 240 may also adopt other passivating processes or combinations, for example, ion implantation and thermal oxidization treatment, which is not limited to this example.

Preferably, as shown in FIG. 6, in this example, for the operation of "passivating treatment", the surface of the first barrier layer 240 basically includes a structure of two film layers after being subjected with passivating treatment. For the convenience of understanding and description, the two film layers of this structure are respectively defined as a first thin film layer 241 and a second thin film layer 242 in the present specification. The first thin film layer 241 is adjacent to the first protective layer 230, and the second thin film layer 242 is far away from the first protective layer 230 (i.e., adjacent to the sacrificial layer 250 formed in a later process). On this basis, the first thin film layer 241 may also be understood as a layered structure that basically maintains the same property and state as the first barrier layer 240 not subjected with the passivating treatment, and the second thin film layer 242 is a layer with changed property and state compared with the first barrier layer 240 not subjected with the passivating treatment. The previously described change of the second thin film layer 242 includes: the etching selectivity of the sacrificial layer 250 to the second thin film layer 242 is greater than that of the sacrificial layer 250 to the first thin film layer 241. That is, the etching selectivity of the sacrificial layer 250 to the first barrier layer 240 is increased after the first barrier layer 240 is subjected with the passivating treatment. In other examples, based on different types of passivating treatment, the first barrier layer 240 may also form a structure of two or more thin film layers. The etching selectivity of the sacrificial layer 250 to at least one layer of thin film structure of the first barrier layer 240 is greater than that of the sacrificial layer 250 to other layers of thin film structures. Alternatively, the first barrier layer 240 subjected with the passivating treatment may also maintain a structure of a single thin film layer, and the etching selectivity of the sacrificial layer 250 to the first barrier layer 240 after treatment is greater than that of the sacrificial layer 250 to the first barrier layer 240 before treatment. That is, the first barrier layer 240 may form various possible layered thin film structures after being subjected with the passivating treatment, and the etching selectivity of the sacrificial layer 250 to the first barrier layer 240 is increased after the first barrier layer 240 is subjected with the passivating treatment.

For example, based on that the material of the first barrier layer 240 includes silicon oxide, meanwhile, based on the design that the passivating treatment includes $N_2$ plasma treatment, in the present implementation manner, the material of the second thin film layer 242 includes silicon oxynitride after the silicon oxide is subjected to the nitrogen plasma treatment. Accordingly, taking the material of the sacrificial layer 250 including silicon nitride as an example, the etching selectivity of silicon nitride to the silicon oxynitride is greater than that of the silicon nitride to silicon oxide, i.e., the etching selectivity of the sacrificial layer 250 to the first barrier layer 240 is increased after the first barrier layer 240 is subjected with the nitrogen plasma treatment.

Preferably, in this example, for the operation that "a first protective layer 240 is formed", the thickness of the first protective layer 240 may preferably be 2 nm to 8 nm, for example, 2 nm, 3 nm, 4 nm, and 5 nm. In other examples, the thickness of the first protective layer 240 may also be less than 2 nm, for example, 1 nm and 1.5 nm, which is not limited to this example. It should be noted that the etching selectivity of the sacrificial layer 250 formed in a later process to the first barrier layer 240 is increased because the present disclosure adopts a process operation of performing passivating treatment on the first barrier layer 240. Therefore, under the same etching condition (for example, the temperature and the concentration of the etching solution, and the cleaning time are the same), the required thickness of the first barrier layer 240 formed according to embodiments of the present disclosure is less than the required thickness of the barrier layer formed in other types of processes if the same etching stripping effect needs to be achieved. That is, the preferred range of the thickness of the first barrier layer 240 in this example cannot be realized by the related art actually, rather than a simple selection of numerical range.

Preferably, based on the design that the passivating treatment include plasma treatment, in this example, for the operation of "passivating treatment", the passivating treatment performed on the first barrier layer 240 may preferably include the following operations.

A treatment chamber of treatment equipment is preheated.

The semiconductor structure with the first barrier layer 240 formed thereon is placed in the treatment chamber.

A reaction medium is input and the surface of the first barrier layer 240 is subjected with the plasma treatment.

The treatment chamber is cooled.

And, the semiconductor structure is taken out.

In addition, the plasma treatment of the first barrier layer 240 may preferably adopt treatment equipment, such as a plasma surface treatment instrument. On this basis, the semiconductor structure is put into the treatment chamber of the plasma surface treatment instrument, and the treatment chamber is preheated before the semiconductor structure is put into the treatment chamber. After the semiconductor structure is put into the preheated treatment chamber, a reaction medium (for example, nitrogen) is input into the treatment chamber, and the surface of the first barrier layer 240 of the semiconductor structure is subjected to plasma treatment by using the reaction medium. After the treatment is completed, the treatment chamber in which the semiconductor structure is placed is cooled. Finally, the cooled semiconductor structure is taken out from the treatment chamber. In other examples, for the operation of "passivating treatment", specific operations and processes of the passivating treatment may also be selected flexibly when other types of plasma treatment processes or other types of passivating processes are adopted, which is not limited to this example.

Figure 7:
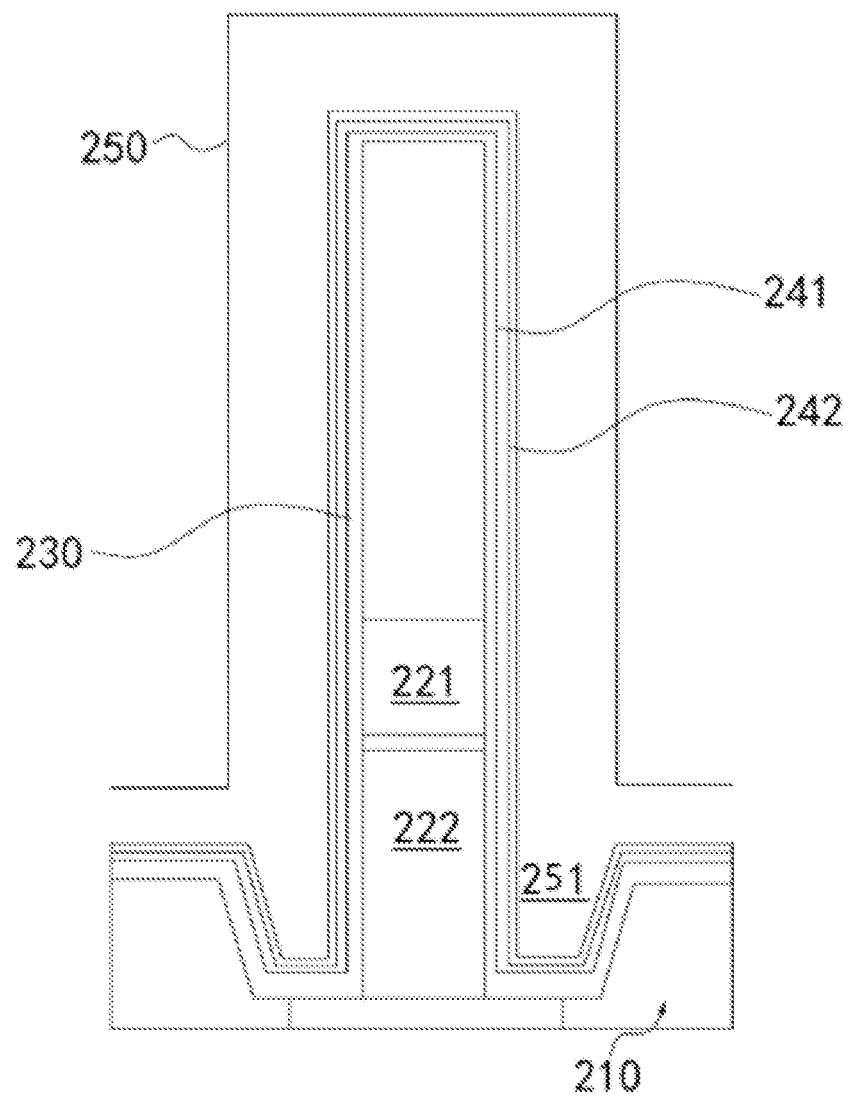
FIG. 7 is an enlarged schematic diagram of one bit line structure of a semiconductor structure in one operation of the method for manufacturing a bit line structure shown in an exemplary example.

Specifically, as shown in FIG. 7, an enlarged layered structure of a semiconductor bit line is specifically shown, which may be used as a representative example of a bit line in the operation that "a sacrificial barrier layer 250 is formed" in this example. The sacrificial layer 250 is formed on a surface of the first barrier layer 240 after being subjected with passivating treatment. In addition, the filling part 251 of the sacrificial layer 250 is filled in the groove 211 (the part without the first protective layer 230 or the first barrier layer 240). That is, the first protective layer 230 and the first barrier layer 240 are formed on a wall and a part groove bottom of the part, not provided with the bit line conductive layer 220 (bit line plug 222), of a groove cavity of the groove 211 in sequence, and the rest groove cavity of the part is filled by the sacrificial layer 250 (filling part 251). On this basis, bit line plug spacer layers 260 are formed in the grooves 211 in two sides of the bit line plug 222 of the semiconductor structure. The bit line plug spacer layer 260 includes the first protective layer 230, the first barrier layer 240, and the un-stripped portion of the sacrificial layer 250 (the filling part 251). In this example, the material of the sacrificial layer 250 may include, but is not limited to, silicon nitride (when the material of the first protective layer 230 also includes silicon nitride, the silicon nitride of the sacrificial layer 250 is Outer SiN).

In addition, the first barrier layer 240 is subjected with passivating treatment before the sacrificial layer 250 is formed in the present disclosure, so that the etching selectivity of the sacrificial layer 250 to the first barrier layer 240 is increased. Specifically, the etching selectivity mentioned above may be defined as the ratio of the etching rate of the etching solution on the former to the etching rate of the etching solution on the latter under the same etching conditions. Accordingly, "the etching selectivity of the sacrificial layer 250 to the first barrier layer 240" is the ratio of the etching of the etching solution on the sacrificial layer 250 to the etching rate of the etching solution on the first barrier layer 240. In addition, the increase of the ratio is equivalent to the faster etching rate of the etching solution on the sacrificial layer 250 under the same etching conditions. Therefore, in a subsequent etching and cleaning operation that "the sacrificial layer 250 is cleaned and stripped", the present disclosure can clean and strip the sacrificial layer 250, and can reduce or avoid the etching of the first barrier layer 240, so as to protect the first protective layer 230 (usually including the same material as the sacrificial layer 250, for example, silicon nitride) inside the first barrier layer 240 from being etched and stripped, thereby protecting the bit line conductive layer 220 inside the first protective layer 230 from etching damage.

Figure 8:
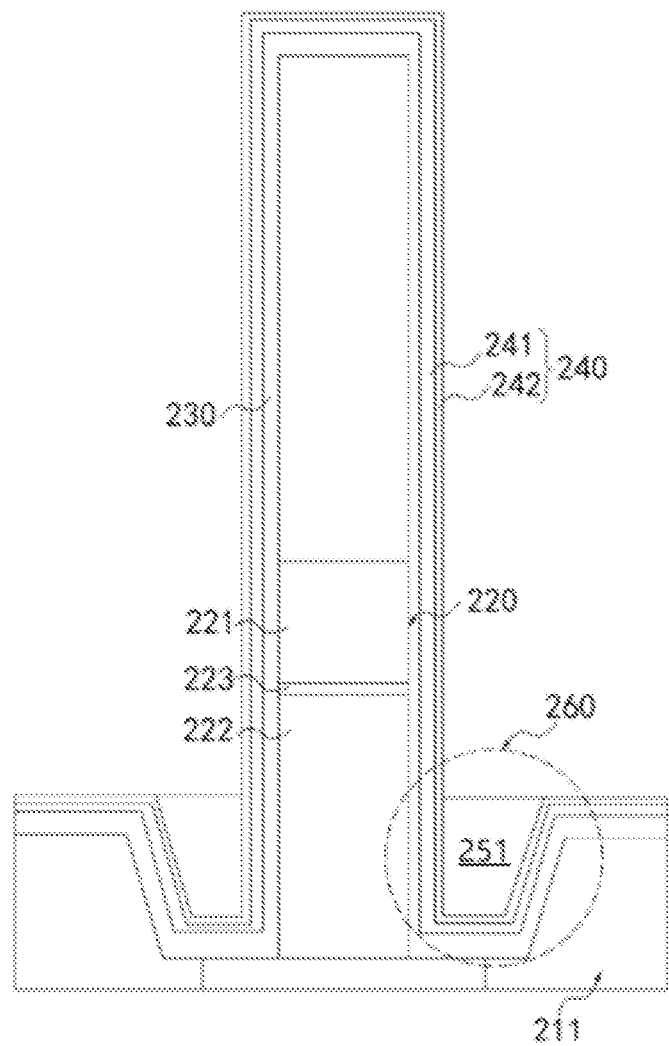
FIG. 8 is an enlarged schematic diagram of one bit line structure of a semiconductor structure in one operation of the method for manufacturing a bit line structure shown in an exemplary example.

Specifically, as shown in FIG. 8, an enlarged layered structure of a semiconductor bit line is specifically shown, which may be used as a representative example of a bit line structure in the operation that "the sacrificial layer 250 is cleaned and stripped" in this example. In this operation, a semiconductor structure after the sacrificial layer 250 is formed is subjected with Wet Clean by using an etching solution, so that the part, other than the filling part 251, of the sacrificial layer 250 is stripped by the etching solution. Accordingly, the first protective layer 230, the first barrier layer 240, and the filling part 251 of the sacrificial layer 250 are still fully filled in the groove 211 of the semiconductor structure after the sacrificial layer 250 is cleaned and stripped, which achieves an effect of preventing badness, such as short circuit, to the maximum extent. So far, the preparation of a semiconductor bit line is basically completed.

Preferably, in this example, for the operation that "the sacrificial layer 250 is cleaned and stripped", the etching solution may preferably include phosphoric acid solution. In this example, the etching solution may also be selected from other types of etching liquid or solution, which is not limited to this example Preferably, in this example, for the operation that "the sacrificial layer 250 is cleaned and stripped", taking the etching solution including phosphoric acid as an example, the temperature of the etching solution may preferably be 100° C. to 120° C., for example, 100° C., 105° C., 110° C., and 120° C. In other examples, the temperature of the etching solution may also be lower than 100° C., or may be higher than 120° C., for example, 95° C., 125° C., 150° C., and 160° C., which is not limited to this example. It should be noted that the etching selectivity of the sacrificial layer 250 formed in the later process to the first barrier layer 240 is increased because the present disclosure adopts a process operation of performing passivating treatment on the first barrier layer 240. The temperature of the etching solution used in the present disclosure is lower than that of the etching solution in the related art, so as to achieve a larger etching selectivity. Of course, in other examples, the present disclosure may also use similar temperature of the etching solution in the related art. That is, the preferred range of the temperature of the etching solution in this example cannot be realized by processes in the related art actually, rather than a simple selection of numerical range.

Preferably, in this example, for the operation that "the sacrificial layer 250 is cleaned and stripped", taking the etching solution including phosphoric acid as an example, the concentration of the etching solution may preferably 40% to 60%, for example, 40%, 45%, 50%, and 60%. In other examples, the concentration of the etching solution may also less than 40%, or greater than 60%, for example, 38%, 65%, 70%, and 85%, which is not limited to this example. It should be noted that the etching selectivity of the sacrificial layer 250 formed in the later process to the first barrier layer 240 is increased because the present disclosure adopts a process operation of performing passivating treatment on the first barrier layer 240. The concentration of the etching solution used by the present disclosure can be less than that of the etching solution in the related art, so as to achieve a larger etching selectivity. Of course, in other examples, the present disclosure may also use similar concentration of the etching solution in the related art. That is, the preferred range of the concentration of the etching solution in this example cannot be realized by the related art actually, rather than a simple selection of numerical range.

Preferably, in this example, for the operation of "the sacrificial layer 250 is cleaned and stripped", the operation that the sacrificial layer 250 is etched and cleaned may preferably include the following operations.

Pre-cleaning is performed on a surface of the sacrificial layer 250 by using diluted hydrofluoric acid solution, so as to strip an oxide layer from the surface of sacrificial layer 250.

The sacrificial layer 250 is cleaned by using phosphoric acid to strip the part, other than the filling part 251, of the sacrificial layer 250.

In addition, during a specific manufacturing process, a primary oxide layer may be formed on the surface of the sacrificial layer 250 because the sacrificial layer 250 is exposed and is in contact with air after the sacrificial layer 250 is formed on the surface of the first barrier layer 240. The primary oxide layer formed on the surface of the sacrificial layer 250 can be effectively stripped in the present disclosure by adding a pre-cleaning operation before cleaning the sacrificial layer 250 by using the etching solution, so that the sacrificial layer 250 is cleaned and stripped more effectively by using the etching solution, and the stability and the controllability of a manufacturing process are better.

Moreover, the previously described specific operation that the sacrificial layer 250 is etched and cleaned may preferably be performed by using a groove type wet process machine. Specifically, the surface of the sacrificial layer 250 may be pre-cleaned for 5 s to 15 s by using the hydrofluoric acid solution that has been diluted according to 200:1. Then, the pre-cleaned semiconductor structure is placed in the groove type wet process machine to perform groove type wet process cleaning by using the phosphoric acid solution at low-temperature and low-concentration (for example, the temperature of 100° C. to 120° C., and the concentration of 40% to 60%), and then is cleaned with water and dried with isopropyl alcohol. The dried semiconductor structure is taken out from the groove type wet process machine.

As mentioned above, in order to demonstrate the efficacy of the method for manufacturing the bit line structure provided by the present disclosure, a large number of experiments and simulation operations are carried out by the applicant, and the results of the experiments and the operations can undoubtedly prove the existence of relevant efficacies of the present disclosure. Relevant efficacies of the present disclosure will be described in combination with the comparison between two specific examples of the present disclosure and the related art.

Referring to Table 1 below, the comparison of the present disclosure and the related art is based on the process conditions of "whether to perform pre-cleaning", "the concentration of an etching solution taking phosphoric acid as an example", "the temperature of the etching solution taking phosphoric acid as an example", and "passivating treatment taking nitrogen plasma treatment as an example", and based on the comparison result of the "etching selectivity" of the sacrificial layer of the semiconductor bit line structure obtained by various processes and the barrier layer (the first barrier layer in the present disclosure). On this basis, for the related art, the process of nitrogen plasma treatment on the barrier layer is not performed, the higher concentration of phosphoric acid is 75% to 88%, the higher temperature of phosphoric acid is 150° C. to 165° C., and the process of pre-cleaning on the sacrificial layer is not performed. The etching selectivity of the sacrificial layer to the barrier layer obtained on this basis is about 5:1. For example 1 of the present disclosure, the process of nitrogen plasma treatment on the first barrier layer is performed, the concentration of phosphoric acid and the temperature of phosphoric acid are the same as those in the related art, and the process of pre-cleaning on the sacrificial layer is also not performed. The etching selectivity of the sacrificial layer to the barrier layer obtained on this basis is about 16:1. For example 2 of the present disclosure: the process of nitrogen plasma treatment on the first barrier layer is performed, the concentration of phosphoric acid is 40% to 60%, the temperature of phosphoric acid is 100° C. to 120° C., and the sacrificial layer is pre-cleaned by using ultra-pure water cleaning, for example, $H_2O:HF(49\%)=200:1$ and the time of 10 s. The etching selectivity of the sacrificial layer to the barrier layer obtained on this basis is about 32:1. Therefore, it can be clearly known that the semiconductor bit line structure prepared by the bit line structure manufacturing method provided by the present disclosure can indeed increase the etching selectivity of the sacrificial layer to the first barrier layer, so as to indeed ensure that a conductive layer inside the first barrier layer cannot be damaged by cleaning and stripping the sacrificial layer by using the etching solution when the thickness of the first barrier layer is relatively small.

TABLE 1

Comparison of etching selectivity between the related art and the examples of the present disclosure

| | Related art | Example 1 of this disclosure | Example 2 of this disclosure |
|---|---|---|---|
| Pre-cleaning | No | No | DHF 200:1; 10 s |
| Concentration of phosphoric acid | 75% to 88% | 75% to 88% | 40% to 60% |
| Temperature of phosphoric acid | 150° C. to 165° C. | 150°C. to 165° C. | 100°C. to 120° C. |
| Nitrogen Plasma Treatment | No | Yes | Yes |
| Etching selectivity | 5:1 | 16:1 | 32:1 |

It should be noted here that the methods for manufacturing the bit line structure shown in the accompanying drawings and described in the present specification are only some examples of the manufacturing method that can adopt the principles of the present disclosure. It should be clearly understood that the principles of the present disclosure are by no means limited to any details or any operations of the method for manufacturing the bit line structure shown in the accompanying drawings or described in the present specification.

Based on previously described detailed description of exemplary examples of the method for manufacturing the bit line structure provided by the present disclosure, an example of a method for manufacturing a semiconductor structure provided by the present disclosure will be described below.

In this example, the method for manufacturing the semiconductor provided by the present disclosure includes the following operations.

A semiconductor substrate is provided, and a surface of semiconductor substrate is provided with a groove.

A bit line structure is formed on the semiconductor substrate by the method for manufacturing the bit line structure provided by the present disclosure and described in the previously described examples.

It should be noted that the method for manufacturing the bit line structure provided by the present disclosure can adopt various possible process operations before and after the formation of the bit line structure in respective examples in accordance with their inventive concepts, so as to form various functional structures or process structures required by the semiconductor structure, which are not limited to the present implementation manner.

For example, the first barrier layer may be stripped and then functional structures, such as the second barrier layer and the second protective layer, are formed in sequence after the bit line structure is formed by the previously described operations of the semiconductor structure manufacturing method provided by the present disclosure. In addition, the operations of forming the previously described various functional structures may still be realized through the processes, such as Deposition (Dep) and etch (Etch). During performing the previously described processes, the processes of patterning and the like may still be realized through process layered structures, such as silicon oxide and silicon nitride, which are not limited to the present implementation manner. Adverse effects on the semiconductor structure caused by surface damage formed on the first barrier layer when the sacrificial layer is stripped can be avoided by forming the second barrier layer and the second protective layer again after stripping the first barrier layer.

It should be noted here that the method for manufacturing the semiconductor structure shown in the accompanying drawings and described in the present specification is only some examples of manufacturing methods that can adopt the principles of the present disclosure. It should be clearly understood that the principles of the present disclosure are by no means limited to any details or any operations of the method for manufacturing the semiconductor structure shown in the accompanying drawings or described in the present specification.

Based on previously described detailed description of exemplary examples of the method for manufacturing the bit line structure and the method for manufacturing the semiconductor structure provided by the present disclosure, an exemplary example of the semiconductor structure provided by the present disclosure will be described below with reference to FIG. 8.

In this example, the semiconductor structure provided by the present disclosure is prepared by the method for manufacturing the semiconductor structure that is provided by the present disclosure and described in the previously described examples.

As shown in FIG. 8, the semiconductor structure provided by the present disclosure includes a semiconductor substrate 210, a bit line conductive layer 220, and a bit line plug spacer layer 260. A surface of the semiconductor substrate 210 is provided with a groove 211. The bit line conductive layer 220 is partially located in a groove 211 in the surface of the semiconductor substrate. The bit line plug spacer layer 260 is filled in the groove, and includes a first protective layer 230, a first barrier layer 240 subjected with the passivating treatment, and a filling part 251.

Preferably, in the example, the first protective layer 230 may preferably have a thickness in range of 1 nm to 3 nm.

Preferably, in the example, the first barrier layer 240 may preferably have a thickness in range of 2 nm to 8 nm.

Preferably, in the example, a material of the first protective layer 230 may preferably include silicon nitride.

Preferably, in the example, a material of the first barrier layer 240 may preferably include silicon oxide.

Preferably, in the example, a material of the filling part 251 may preferably include silicon nitride.

Preferably, in the example, the first barrier layer 240 subjected with the passivating treatment includes a structure of two thin film layer, respectively a first thin film layer 241 adjacent to the first protective layer 230 and a second thin film layer 242 far away from the first protective layer 230. The etching selectivity of the filling part 251 to the second thin film layer 242 is greater than that of the filling part 251 to the first thin film layer 241.

Preferably, in the present implementation manner, the material of the first thin film layer 241 includes silicon oxide, and the material of second thin film layer 242 includes silicon oxynitride.

It should be noted here that the semiconductor structure shown in the accompanying drawings and described in the present specification is only a few examples of many semiconductor structures that can adopt the principles of the present disclosure. It should be clearly understood that the principles of the present disclosure are by no means limited to any details or any component of the semiconductor structure shown in the accompanying drawings or described in the present specification.

In conclusion, the etching selectivity of the etching solution on the sacrificial layer to that on the first barrier layer is increased by performing passivating treatment on the first barrier layer, so that the conductive layer in the first barrier layer cannot be damaged when the sacrificial layer is cleaned and stripped by using the etching solution. Moreover, on the basis of achieving the above effects. The present disclosure does not need to add an active agent to the etching solution, compared with the related art. Therefore, the cleaning process of the present disclosure is relatively simple, and will not affect the product yield. In addition, the present disclosure can further meet the design requirements of refinement and thinning of critical dimensions of a semiconductor product without increasing the thickness of the first barrier layer.

Although the present disclosure has been described with reference to several typical embodiments, it should be noted that the used terms are illustrative and exemplary rather than restrictive terms. Since the present disclosure can be implemented in various forms without departing from the spirit or essence of the disclosure, it should be understood that the previously described embodiments are not limited to any of the foregoing details, but should be widely interpreted within the spirit and scope defined by the accompanying claims. Therefore, all changes and modifications falling into the claims or their equivalent scope should be covered by the accompanying claims.

What is claimed is:

1. A method for manufacturing a bit line structure, comprising:
   forming a bit line conductive layer on a surface of a semiconductor substrate, wherein the bit line conductive layer is partially located in a groove in the surface of the semiconductor substrate;
   forming a first protective layer on a surface of the bit line conductive layer and the surface of the semiconductor substrate;
   forming a first barrier layer on a surface of the first protective layer;
   subjecting the surface of the first barrier layer with passivating treatment;
   forming a sacrificial layer on the surface of the first barrier layer, wherein the sacrificial layer is provided with a filling part filled in the groove; and cleaning and stripping a part, other than the filling part, of the sacrificial layer by using an etching solution;
wherein the first barrier layer subjected with the passivating treatment comprises a first thin film layer and a second thin film layer; and
wherein a material of the first thin film layer comprises silicon oxide, and a material of the second thin film layer comprises silicon oxynitride.

2. The method for manufacturing the bit line structure according to claim 1, wherein the passivating treatment comprises plasma treatment, ion implantation, or thermal oxidation treatment.

3. The method for manufacturing the bit line structure according to claim 1, wherein the first thin film layer is adjacent to the first protective layer and the second thin film layer is distal from the first protective layer, wherein an etching selection ratio of the sacrificial layer to the second thin film layer is greater than an etching selection ratio of the sacrificial layer to the first thin film layer.

4. The method for manufacturing the bit line structure according to claim 3, wherein
a material of the first barrier layer comprises silicon dioxide; and
the passivating treatment comprises nitrogen plasma treatment.

5. The method for manufacturing the bit line structure according to claim 1, wherein the first protective layer has a thickness in range of 1 nm to 3 nm, and the first barrier layer has a thickness in range of 2 nm to 8 nm.

6. The method for manufacturing the bit line structure according to claim 1, wherein a material of the first protective layer comprises silicon nitride, a material of the first barrier layer comprises silicon oxide; and the material of the sacrificial layer comprises silicon nitride.

7. The method for manufacturing the bit line structure according to claim 1, wherein the etching solution comprises phosphoric acid solution; and a temperature of the etching solution is 100° C. to 120° C.

8. The method for manufacturing the bit line structure according to claim 1, wherein the etching solution comprises phosphoric acid; and a concentration of the etching solution is 40% to 60%.

9. The method for manufacturing the bit line structure according to claim 1, after cleaning and stripping the part, other than the filling part, of the sacrificial layer by using the etching solution, further comprising:
stripping an exposed portion of the first barrier layer;
forming a second barrier layer on the surface of the bit line conductive layer and the surface of the semiconductor substrate; and
forming a second protective layer on a surface of the second barrier layer.

10. A method for manufacturing a bit line structure, comprising:
forming a bit line conductive layer on a surface of a semiconductor substrate, wherein the bit line conductive layer is partially located in a groove in the surface of the semiconductor substrate;
forming a first protective layer on a surface of the bit line conductive layer and the surface of the semiconductor substrate;
forming a first barrier layer on a surface of the first protective layer;
subjecting the surface of the first barrier layer with passivating treatment;
forming a sacrificial layer on the surface of the first barrier layer, wherein the sacrificial layer is provided with a filling part filled in the groove; and
cleaning and stripping a part, other than the filling part, of the sacrificial layer by using an etching solution;
wherein the cleaning and stripping the sacrificial layer by using the etching solution comprises:
pre-cleaning a surface of the sacrificial layer by using a diluted hydrofluoric acid solution, so as to strip an oxide layer from the surface of the sacrificial layer; and
cleaning the sacrificial layer by using phosphoric acid solution, so as to strip the part, other than the filling part, of the sacrificial layer.

11. A method for manufacturing a semiconductor structure, comprising:
providing a semiconductor substrate, wherein the surface of the semiconductor substrate is provided with a groove; and
forming a bit line structure on the semiconductor substrate by the method for manufacturing the bit line structure according to claim 1.

12. The method for manufacturing the semiconductor structure according to claim 11, wherein the passivating treatment comprises plasma treatment; and the passivating treatment on the first barrier layer comprises following operations:
pre-heating a treatment chamber of treatment equipment;
placing the semiconductor structure with the first barrier layer formed thereon in the treatment chamber;
inputting a reaction medium and subjecting the surface of the first barrier layer with the plasma treatment;
cooling the treatment chamber; and
taking out the semiconductor structure.

13. A semiconductor structure, comprising:
a semiconductor substrate, a surface of the semiconductor substrate being provided with a groove;
a bit line conductive layer, the bit line conductive layer being partially located in a groove in the surface of the semiconductor substrate; and
a bit line plug spacer layer, the bit line plug spacer layer being filled in the groove, and the bit line plug spacer layer comprising a first protective layer, a first barrier layer subjected with passivating treatment, and a filling part;
wherein the first barrier layer subjected with the passivating treatment comprises a first thin film layer and a second thin film layer; and
wherein a material of the first thin film layer comprises silicon oxide, and a material of the second thin film layer comprises silicon oxynitride.

14. The semiconductor structure according to claim 13, wherein the first protective layer has a thickness in range of 1 nm to 3 nm.

15. The semiconductor structure according to claim 13, wherein the first barrier layer has a thickness in range of 2 nm to 8 nm.

16. The semiconductor structure according to claim 13, wherein a material of the first protective layer comprises silicon nitride.

17. The semiconductor structure according to claim 13, wherein a material of the first barrier layer comprises silicon oxide.

18. The semiconductor structure according to claim 13, wherein a material of the filling part comprises silicon nitride.

19. The semiconductor structure according to claim 13, wherein the first thin film layer is adjacent to the first protective layer and second thin film layer is distal from the first protective layer, wherein an etching selectivity of the filling part to the second thin film layer is greater than an etching selectivity of the filling part to the first thin film layer.

* * * * *